US 6,355,567 B1

(12) United States Patent
Halle et al.

(10) Patent No.: US 6,355,567 B1
(45) Date of Patent: Mar. 12, 2002

(54) RETROGRADE OPENINGS IN THIN FILMS

(75) Inventors: Scott D. Halle; Paul C. Jamison; David E. Kotecki, all of Hopewell Junction; Richard S. Wise, Beacon, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/345,646

(22) Filed: Jun. 30, 1999

(51) Int. Cl.[7] ............................................. H01L 21/311
(52) U.S. Cl. ...................... 438/700; 438/701; 438/704; 438/713
(58) Field of Search ................................ 438/706, 719, 438/723, 724, 733, 700, 701, 704, 713

(56) References Cited

U.S. PATENT DOCUMENTS

| | | | | | |
|---|---|---|---|---|---|
| 4,341,010 A | * | 7/1982 | Tijburg et al. | ................ | 29/580 |
| 4,376,672 A | * | 3/1983 | Wang et al. | ................ | 156/643 |
| 4,726,879 A | * | 2/1988 | Bondur et al. | ............... | 156/643 |
| 5,423,941 A | * | 6/1995 | Komura et al. | ........... | 156/643.1 |
| 5,494,843 A | * | 2/1996 | Huang | ........................ | 437/56 |
| 5,532,177 A | * | 7/1996 | Cathey | ........................ | 437/40 |
| 5,662,768 A | * | 9/1997 | Rostoker | ..................... | 257/301 |
| 5,766,988 A | * | 6/1998 | Cho et al. | .................... | 438/159 |
| 5,814,555 A | * | 9/1998 | Bandyopadhyay et al. | . | 438/619 |
| 5,817,580 A | * | 10/1998 | Violette | ....................... | 438/756 |

* cited by examiner

Primary Examiner—Benjamin L. Utech
Assistant Examiner—Charlotte A. Brown
(74) Attorney, Agent, or Firm—Ratner & Prestia; H. Daniel Schnurmann

(57) ABSTRACT

Retrograde openings in thin films and the process for forming the same. The openings may include conductive materials formed within the openings to serve as a wiring pattern which includes wires having tapered cross sections. The process involves a two-step etching procedure for forming a retrograde opening within a film having a gradient of a characteristic that influences the etch rate for a chosen etchant species. An opening is first formed within the film by an anisotropic etch process. The opening is then converted to an opening including retrograde features by an isotropic etch process which is selective to the characteristic. Thereafter, the retrograde opening is filled with a conductive material, in one case, by electroplating or other deposition techniques.

10 Claims, 7 Drawing Sheets

RETROGRADE OPENINGS IN THIN FILMS

TECHNICAL FIELD

The present invention relates to a process and structure for producing etched openings in films. The etched openings include retrograde features. More particularly, the present invention is related to processes and structures used to create a retrograde opening, within a thin film having a characteristic which forms a gradient from the top to the bottom of the film, and to fill the opening with an electrodeposited film.

BACKGROUND OF THE INVENTION

In the modern semiconductor device manufacturing industry, there exists a need to form openings having retrograde features within the thin films used in the formation of semiconductor integrated circuit devices. A retrograde opening extending down from a top surface of a thin film includes a bottom section having a greater lateral dimension than the top section of the opening. Relatively straight sidewalls give the cross section of the opening a tapered or trapezoidal appearance. Retrograde openings may be subsequently filled with materials which are used in various applications.

One such application may be to form a conductive material within the retrograde opening using chemical vapor deposition (CVD) techniques. A material formed within a retrograde opening using CVD techniques may additionally include air gaps along the sides of the conductive material and within the retrograde opening. If, for example, damascene processing techniques are used to form a wiring pattern of the conductive material, then the parasitic capacitance between adjacent conductive lines may be reduced because of the lowered dielectric constant of the air gap, as compared to that of the dielectric film within which the opening is formed.

Another application of a retrograde opening within a thin film is the subsequent electrodeposition of a conductive film to completely fill the retrograde opening. After the excess conductive material is removed from the top surface of the film, a wiring pattern is produced of the electrodeposited conductive material. If the dielectric film, in which the original retrograde opening was formed, is subsequently removed, a wiring pattern results. The wiring pattern includes wires having tapered cross-sections. In the modern semiconductor processing industry, many films which form desirable interconnect materials, such as platinum, are resistant to etching using conventional methods. It is therefore difficult to create a controllably tapered wiring pattern by forming a continuous platinum film on a substrate surface, then selectively removing portions of the film by etching. In addition, wet and plasma chemical etching techniques are generally isotropic in nature, etching equally in all directions, and cannot be used to produce retrograde features having controlled configurations.

Conventional reactive ion etch (RIE) processes are generally anisotropic processes which etch in one direction and form openings having a generally vertical profile. Conventional RIE processes commonly depend upon the formation of generally polymeric bi-products formed during the etch process. These bi-products adhere to sidewalls or other exposed etch features, thereby passivating the exposed surfaces and influencing the shape of the final, formed opening. Because of the passivation of the bi-products, openings formed by conventional RIE (dry) etching processes generally have an angle of 90° or larger (i.e., not retrograde) between the bottom and sidewalls.

Attempts directed to forming a retrograde opening within thin films have generally included forming an etchable homogenous film, then etching the film using an etch process whereby the etch conditions are varied during the etch process to alter the etch rate or the degree of isotropy of the etch during the course of the etch process. RIE processes are typically used for such an application. RIE conditions such as gas flow, temperature, pressure, and RF power can typically be varied during the course of an etch process using automated equipment available in the modern semiconductor device manufacturing industry.

The non-conventional RIE processes commonly used in attempting to form retrograde openings within thin films are sensitive processes which are difficult to continuously control during the course of a dynamic etch process and also from run-to-run. As noted above, RIE processes commonly depend upon the formation of generally polymeric bi-products formed during the etch process, which passivate exposed surfaces by adhering to them. The formation and adhesion of these passivating etch bi-products are very sensitive to localized processing conditions and, therefore, are difficult to control.

Other attempts to form retrograde openings within thin films include forming a pattern above an initially deposited, relatively homogenous film; introducing impurities into discrete sections within the deposited film; then re-patterning and etching, using the different etch characteristics of the discrete, impurity sections of the film with respect to the bulk, as-deposited film. These processes require multiple patterning operations having tight alignment tolerances.

SUMMARY OF THE INVENTION

The present invention is directed to the shortcomings of conventional methods for forming retrograde openings within the thin films used in the formation of semiconductor devices. The present invention provides an etchable film having a characteristic which varies from the top to the bottom of the film. The etch rate of the film for a chosen etchant species is sensitive to this characteristic which forms a gradient within the film. In one embodiment, the film may be formed as a series of individually formed sub-layers.

The present invention provides a two-step process including a first anisotropic etch process, followed by an isotropic etch process using an etchant species that is selective to the characteristic which is varied from top to bottom of the film. The isotropic etch process is conducted after an anisotropic etch process is used to form openings within the film. The isotropic etch process converts the anisotropic openings to openings having retrograde characteristics. The present invention also forms a wiring pattern by providing conductive material within the retrograde openings by electrodeposition or other known deposition mechanisms.

DESCRIPTION OF THE DRAWING

The invention is best understood from the following detailed description when read in connection with the accompanying drawing. It is emphasized that, according to common practice, the various features of the drawing are not-to-scale. On the contrary, the dimensions of the various features are arbitrarily expanded or reduced for clarity. Included in the drawing are the following figures.

DETAILED DESCRIPTION

Figure 8:
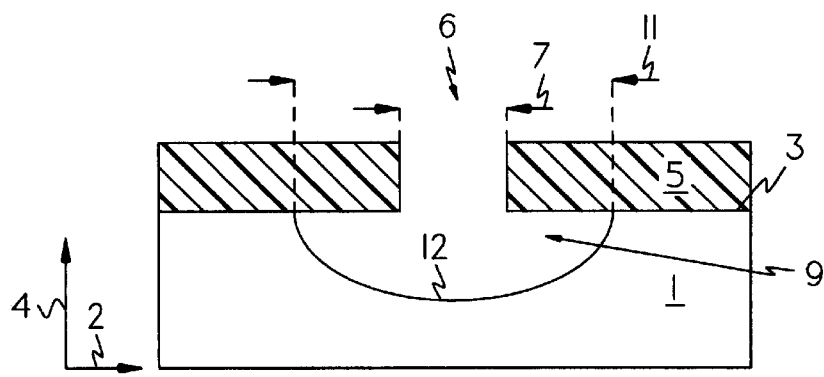
FIG. 8 is a cross-sectional view showing an opening formed by an isotropic etch process as in the prior art.

FIG. 8 is a cross-sectional view showing an opening formed within a film according to conventional isotropic etching methods as in the prior art. Film 1 may represent any thin film formed on a semiconductor substrate, for example, and which includes film qualities that are relatively consistent throughout the horizontal and vertical dimensions of the film. In other words, film 1 is a relatively homogenous film. Film 1 may be formed using any suitable conventional method, and may include dopant impurities uniformly distributed throughout the film.

Additionally or alternatively, film 1 may be comprised of a multitude of components which are evenly distributed throughout the film. As such, with respect to a given etchant species, all sections of the film are equally resistant to being etched. Stated otherwise, the etch rate of the film with respect to a chosen etchant species is relatively consistent throughout the horizontal 2 and vertical 4 dimensions of film 1.

A masking film 5 is used to form an opening 6 having a width 7 over the top surface 3 of film 1. Masking film 5 may typically be a photoresist film common to the semiconductor manufacturing industry. It can be seen that the opening 9 formed by etching film 1 through opening 6 has a generally curved shape, and includes maximum lateral component 11 which is greater than the width 7 of opening 9. Maximum lateral component 11 is not included along the lowermost section 12 of opening 9. This is because, once the etchant species comes in contact with film 1, film 1 is etched equally in all directions by the etchant species. When masking film 5 is removed (not shown), it can be seen that opening 9 will be generally rounded and concave.

Figure 9:
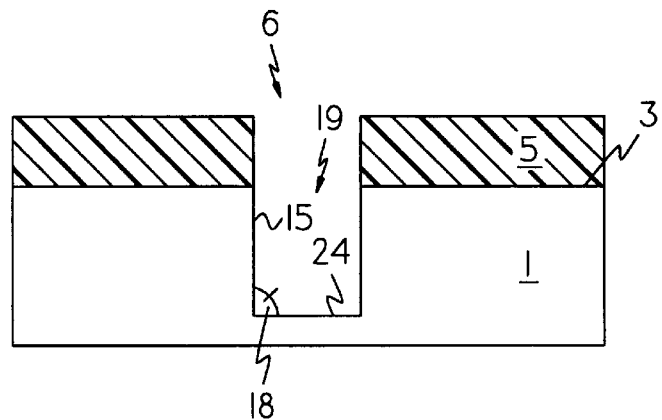
FIG. 9 is a cross-sectional view showing an opening formed by an anisotropic etch process as in the prior art.

FIG. 9 shows an opening 19 formed within film 1 by anisotropically etching film 1 through opening 6 formed in masking film 5 as in the prior art. It can be seen that anisotropic opening 19 includes generally straight and vertical sidewalls 15 formed as a result of choosing the etch conditions to etch film I downward from opening 6 formed within masking film 5 on top surface 3 of film 1. The lateral dimensions of opening 19 are approximately equal to opening 6 formed within masking film 5. It can be seen that angle 18 formed between the bottom surface 24 and sidewall 15 of opening 19 is about 90°.

Figure 10:
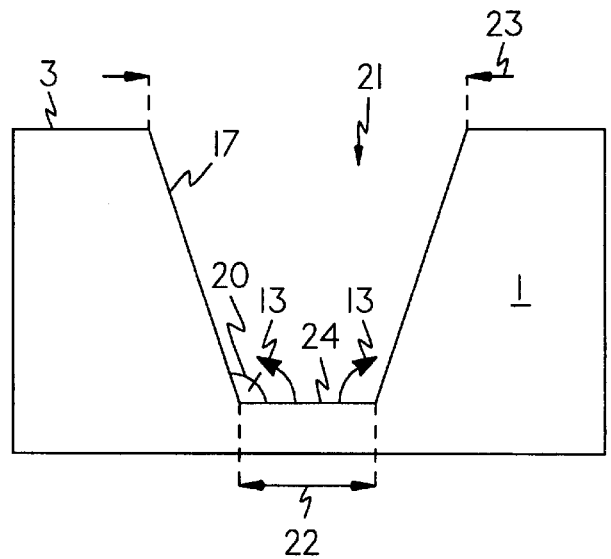
FIG. 10 is a cross-sectional view showing an opening formed using an etch process including back-sputtering as in the prior art.

FIG. 10 is another prior art opening formed within a film and includes a tapered feature whereby the opening 21 includes a width 23 at the top greater than the width 22 at the bottom of opening 21. The sidewalls 17 are generally straight, but angled, thereby providing generally tapered opening 21. Opening 21 may be formed in film 1 using conventional RIE techniques in which the etch process conditions are chosen so that there is back. sputtering (shown by arrows 13) of generally polymeric etch bi-products which are sputtered from the bottom surface 24 and form on sidewall 17 during the etch process, thereby passivating sidewalls 17 and urging the formation of tapered opening 21. It can be seen that angle 20 formed between bottom surface 24 and sidewall 17 of opening 21 is greater than 90°.

Description of the Preferred Embodiments of the Invention

Figure 1:
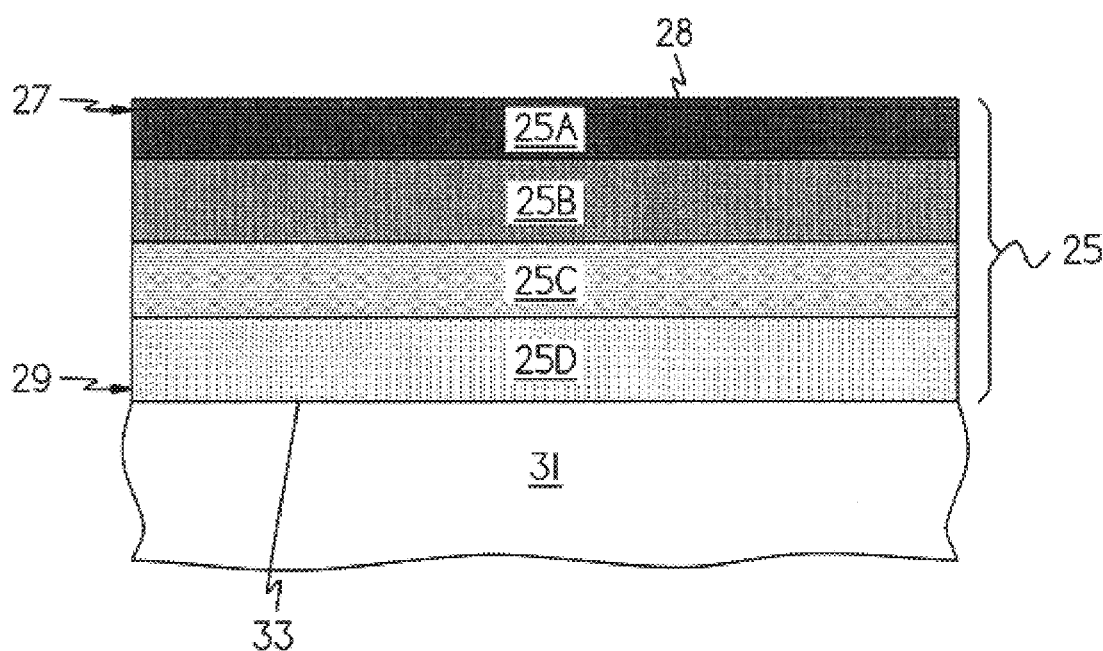
FIG. 1 is a cross-sectional view showing an exemplary embodiment of a layered film.

FIG. 1 is a cross-sectional view showing the film structure in which the retrograde opening will be formed, according to the process of the present invention. As shown in FIG. 1, a film 25 includes sub-layers 25A, 25B, 25C, and 25D which are formed of the same material, except that they each include a characteristic which distinguishes one sub-layer from another. Sub-layers 25A, 25B, 25C, and 25D are formed over the surface 33 of a stopping layer 31. In an exemplary embodiment, stopping layer 31 may comprise a silicon or other semiconductor substrate. In alternative embodiments, stopping layer 31 may include a structure formed on a semiconductor device before the introduction of film 25, or stopping layer 31 may represent any arbitrary location where the etch process may be halted. In an exemplary embodiment, stopping layer 31 and film 25 may each represent portions of the same film structure.

Film 25 has a characteristic that is varied from the top 27 to the bottom 29 of film 25. In an exemplary embodiment, the characteristic may be a dopant impurity added to film 25. In the exemplary embodiment shown in FIG. 1, sub-layer 25A may have a higher concentration of the dopant impurity than sub-layer 25B which, in turn, has a higher dopant concentration than sub-layer 25C which, in turn, has a higher dopant concentration than sub-layer 25D. In this manner, film 25 includes a concentration gradient, increasing from bottom 29 to top 27. Alternatively, a dopant concentration gradient may progressively increase from sub-layer 25A through sub-layer 25D.

In another exemplary embodiment, the characteristic may represent one of the components which form film 25. For example, a film formed of components "X", "Y", and "Z" may have a gradient for which the relative amount of "Z" in the film increases from top to bottom. In another exemplary embodiment, the characteristic may represent a structural aspect of the film such as the degree of structural order. In each of the embodiments, the characteristic progressively increases or decreases from the top to the bottom of the film and influences the etch rate of the film with respect to an etchant species chosen to etch the film.

It is emphasized that film 25 is shown as being divided into discrete sub-layers 25A, 25B, 25C, and 25D for purposes of clarity only. In one exemplary embodiment, film 25 may be formed of four individually formed sub-layers as shown in FIG. 1. In other exemplary embodiments, film 25 may be formed of any number of discrete sub-layers which, together, produce a gradient of the characteristic from top to bottom or vice-versa. In another exemplary embodiment, film 25 may be a generally continuous film, not including discrete sub-layers, but in which a characteristic of the film is progressively increased or decreased from top to bottom or from bottom to top.

In an exemplary embodiment, film 25 may be comprised of successively and individually formed sub-layers 25A–25D. Each sub-layer 25A–25D is formed of the same bulk film material and contains a dopant impurity. The dopant concentration within each sub-layer may progressively increase or decrease from film sub-layer 25A to film sub-layer 25D.

Film 25 may represent any film that may be etched in the semiconductor device manufacturing industry. For example, film 25 may be a dielectric film. In a first exemplary embodiment, film 25 may be a silicon oxynitride ($SiO_xN_y$) dielectric film. In the first exemplary embodiment, the characteristic of film 25 may be the nitride-to-oxide ratio within the film ($Si_3N_4/SiO_2$ ratio). In the first exemplary embodiment, the nitride/oxide ratio may progressively increase from top 27 to bottom 29 of film 25.

The present invention may be used to form a retrograde opening within any film used in the manufacture of semiconductor devices in which a retrograde feature is desired. The invention finds particular application in forming retrograde openings within dielectric films, in which subsequent fabrication steps include the introduction of a conductive material into the retrograde openings. In this example, the conductive material within the openings may produce a wiring pattern. This is particularly advantageous for films such as platinum which are difficult to pattern otherwise. If electrodeposition techniques such as electroplating are used to completely fill the retrograde openings with a conductive material, the wires of the wiring pattern will include a tapered slope. Such a configuration is highly desirable for subsequent processing operations.

Figure 2:
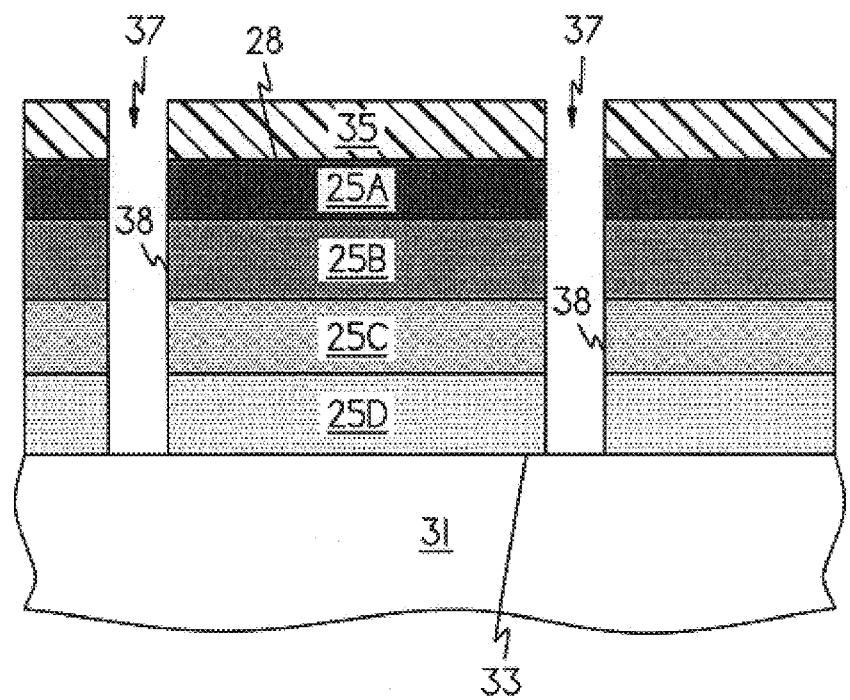
FIG. 2 is a cross-sectional view showing an anisotropic opening formed within the film shown in FIG. 1.

Now turning to FIG. 2, a masking film 35 has been formed over the top surface 28 of film 25. In an exemplary embodiment, a photosensitive film, such as a photoresist common in the art, may be used. Any suitable method for forming a pattern within masking film 35 may be used. After a pattern has been formed within masking film 35, an anisotropic etching process is used to form the anisotropic openings 37 in film 25. It can be seen that anisotropic openings 37 have sidewalls 38 which are generally straight, generally parallel to each other, and generally orthogonal with respect to top surface 28 and surface 33. Openings 37 extend down to surface 33 of stopping layer 31.

The anisotropic etching process chosen may be a RIE process commonly used in the semiconductor device manufacturing industry but other suitable anisotropic etch processes may be used. The anisotropic etching process is a directional process chosen to produce openings 37 as described above. The anisotropic etch process is not selective, therefore, to the characteristic which is varied throughout the depth of film 25. In the first exemplary embodiment using a silicon oxynitride film having a varying nitride/oxide ratio, the anisotropic etch process is chosen to be non-selective to nitride or oxide. In this manner, both the top 27 of film 25, having a lower nitride/oxide ratio, and the bottom 29, having a higher nitride/oxide ratio, etch at the same rate and with the same degree of anisotropy, enabling the formation of anisotropic openings 37.

Figure 3:
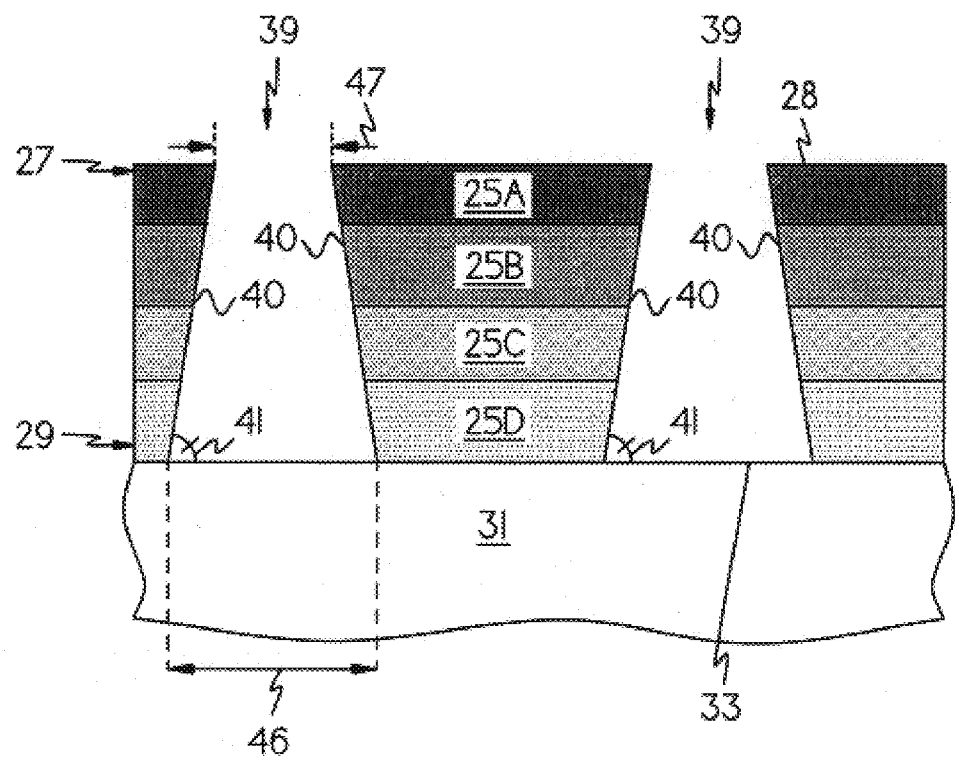
FIG. 3 is a cross-sectional view which follows FIG. 2 in the process sequence and includes a retrograde opening.

Referring to FIG. 3, after masking film 35 is removed using conventional methods, retrograde openings 39 are formed within film 25 using an isotropic etch process chosen in conjunction with the characteristic varied from the top to the bottom of film 25. In an exemplary embodiment, a dry chemical, or plasma etching technique will be used. The etchant species and the etch process conditions are chosen in conjunction with the characteristic of film 25 which is varied to form a gradient from top 29 to bottom 27 of film 25. The isotropic etch process is chosen to be selective to the characteristic varied. More specifically, the etch process and etch species are chosen and film 25 is formed so that the etch rate at the top 29 of film 25 is greater than the corresponding etch rate at the bottom 27.

In the exemplary embodiment, for example, the etch rate of sub-layer 25D is greater than the corresponding etch rate of sub-layer 25C, which is greater than the corresponding etch rate of sub-layer 25B, which, in turn, is greater than the corresponding etch rate of sub-layer 25A, with respect to the chosen isotropic etch process and etchant species. In this manner, retrograde openings 39 are formed from the originally anisotropic openings 37 (as in FIG. 2) formed by the initial anisotropic etching process. Retrograde openings 39 are produced because the material toward bottom 27 of film 25 etches faster than the material toward top 29 of film 25, thereby producing openings 39 that have a bottom width 46 which is greater than the width 47 at the top of the opening. Openings 39 have sidewalls 40.

In the preferred embodiment in which stopping layer 31 is a different material that is not etched by the etchant used in the isotropic etchant process, the surface 33 originally formed as in FIG. 2 does not change. The original opening 37 extends laterally to a greater degree toward the bottom of opening 39 than toward the top, thereby producing the retrograde opening 39 as described above. It can be also seen that retrograde openings 39 each include lower corners 41 having a re-entrant angle which is less than 90°.

In alternative embodiments in which stopping layer 31 is etched during the isotropic etch process, the retrograde openings (not shown) will have tapered sidewalls as in FIG. 3. The original bottom surface will be extended downward, however, and will have a generally concave shape.

An exemplary process, for selectively isotropically etching the silicon oxynitride film having the gradient described as in the first exemplary embodiment, can be achieved by using chemical downstream etching (CDE). The system used to carry out the CDE process may include a remote plasma source (for example, a microwave) sufficiently upstream such that only long-lived neutral species (i.e., no ions) are present at the wafer surface. Using a non-directional flow and a halogen, the process chemically etches the exposed surfaces in a purely isotropic manner. The chemical selectivity of the etch process can be varied over a wide range typically by varying the gas flow ratio of the source gases.

In the first exemplary embodiment, a mixture of gases $CF_4$, $O_2$, and $N_2$ is used at a ratio mixture of roughly 5:4:1 ($CF_4:O_2:N_2$) to produce the desired selectivity. Using an etch gas mixture of the above composition, for example, a nitride-to-oxide etch selectivity of approximately 10:1 may be obtained. In this manner, the nitride-rich bottom 29 of film 25 etches faster than the nitride-deficient top 27 of film 25.

In other exemplary embodiments, etch gas mixtures having different ratios of etchant species $CF_4$, $O_2$, and $N_2$ may be used, depending on the etch selectivity desired and, in turn, on the profile of the etched opening sought to be achieved. For an etchant gas mixture of a given composition, the selectivity of the gas mixture to the film characteristic may also be varied by altering the etch process conditions. For example, because the nitride etch rate is thermally activated, higher etch selectivities using the 5:4:1 etchant gas mixture may be obtained at lower temperatures.

It should be understood that the gas mixture using $CF_4$, $O_2$, and $N_2$ gasses as etchant species is an exemplary mixture only. Other gas mixtures may be used to etch the silicon oxynitride film as in the first exemplary embodiment. In alternative embodiments, selective wet chemical etch processes may be used to isotropically etch the silicon oxynitride film.

It should be further understood that the silicon oxynitride film as in the first exemplary embodiment is exemplary, not restrictive, of films which may have retrograde openings formed within them. Any of various films used in the semiconductor device manufacturing industry may be formed to include a characteristic having a gradient from the top to the bottom of the film. Similarly, any of various corresponding etchant processes and species, which are selective to the characteristic varied, may be used to form a retrograde opening within the film after the formation of the anisotropic opening.

The openings 39 shown in FIG. 3 may be formed in any suitable film requiring retrograde openings. One such application is the formation of retrograde openings 39 in a dielectric film as in the first exemplary embodiment. Often, a conductive material is subsequently formed within openings 39.

Figure 4:
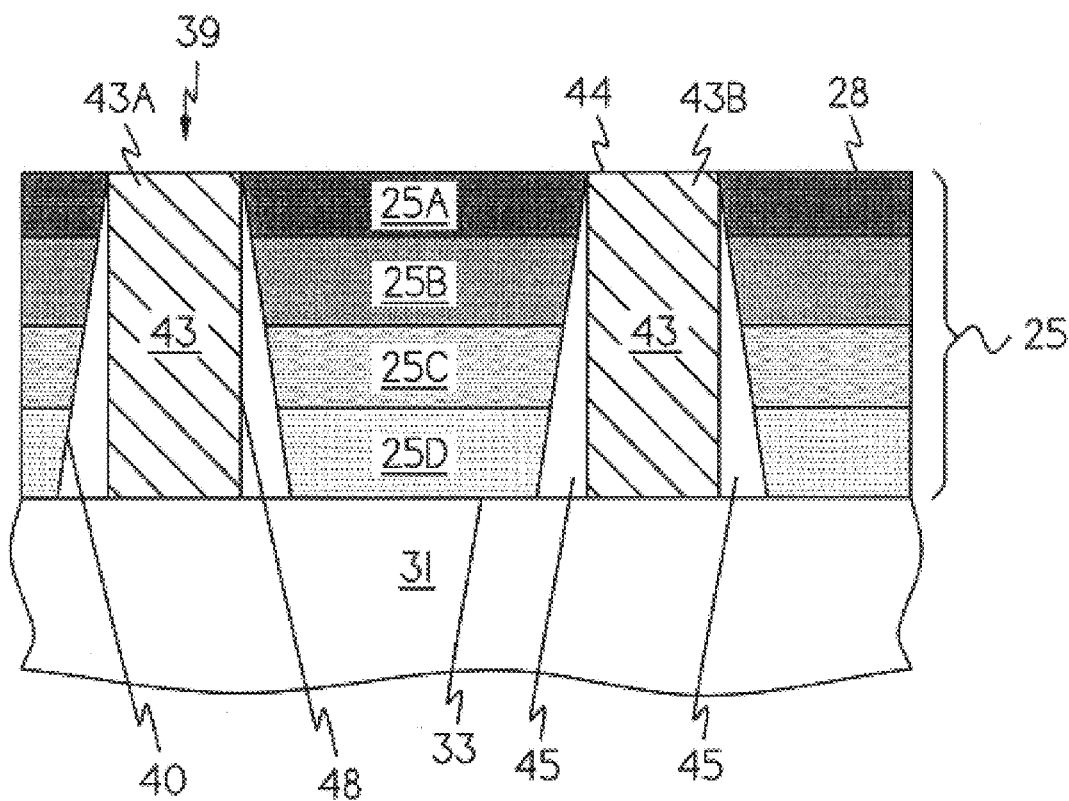
FIG. 4 is a cross-sectional view of an exemplary embodiment which follows FIG. 3 in the process sequence and includes a conductive material formed within the retrograde opening.

FIG. 4 is a cross-sectional view showing an exemplary embodiment of a conductive material formed within retrograde openings 39 formed in film 25. In an exemplary embodiment, conductive material 43 may be provided within openings 39 formed within a dielectric film. Conductive material 43 may be formed in openings 39 using chemical vapor deposition (CVD), sputtering, or other deposition methods. In an exemplary embodiment, a film of conductive material 43 may be formed within openings 39 and (although not shown) over top surface 28 of film 25. The excess of conductive material 43 is removed from top surface 28, by chemical mechanical polishing (CMP) or other methods, to form a planar top surface 44. In two exemplary embodiments, the conductive material formed using CVD methods may be tungsten, and the conductive material formed using sputtering techniques may be aluminum. In alternative embodiments, the conductive material may be formed of other materials and according to other processing techniques.

After the conductive material 43 is formed within opening 39 and polishing techniques such as CMP have been used to remove portions of conductive material 43 extending above top surface 28, a wiring pattern is formed of conductive film 43 within dielectric film 25. Within openings 39, air gaps 45 are created between sidewalls 48 of conductive material 43 and sidewalls 40 of opening 39. Air has a lower dielectric constant than the dielectric films which are used in the formation of a semiconductor device such as the silicon oxynitride film in the first exemplary embodiment. As such, the effective dielectric constant between adjacent conductive lines 43A and 43B shown in FIG. 4 will be effectively lowered when compared to adjacent conductive lines spaced apart at the same spacing, within the same dielectric film, and which do not include air gaps. The lowered effective dielectric constant lowers the parasitic capacitance created between adjacent conductive lines.

Figure 5:
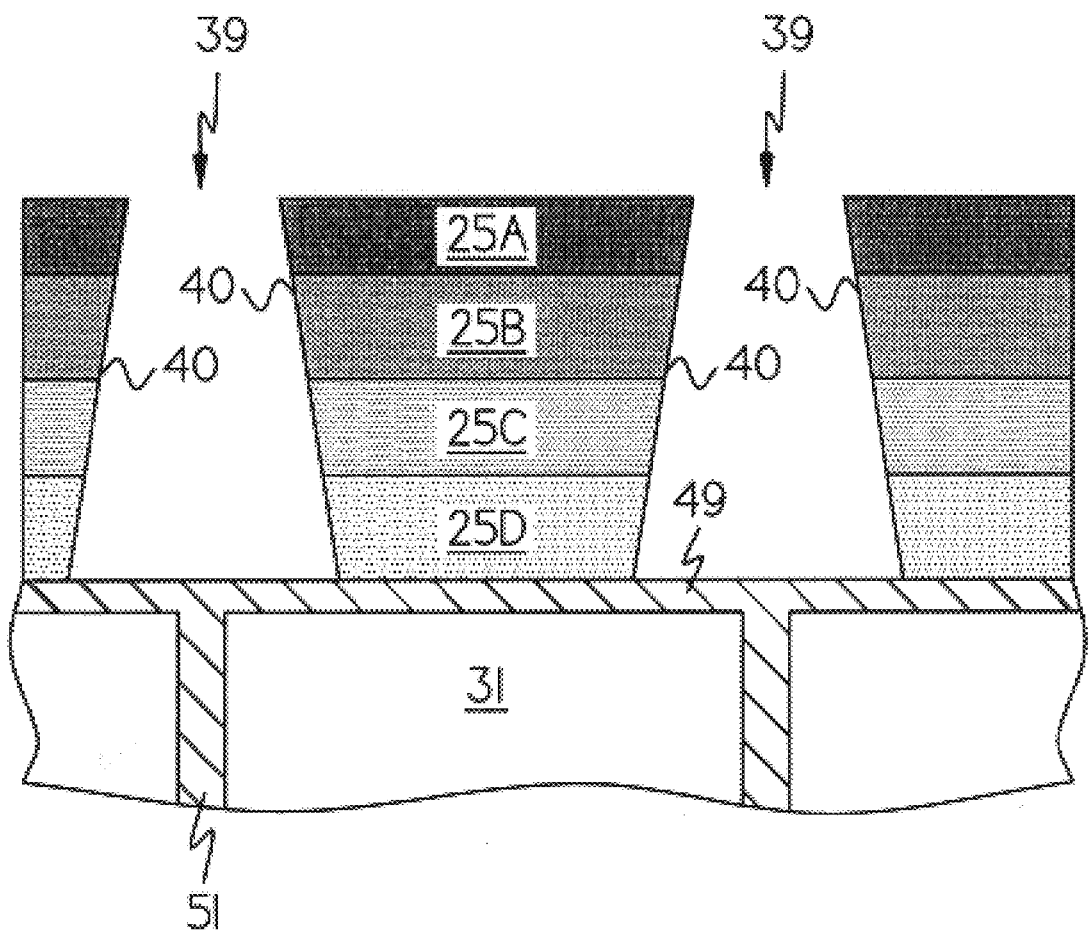
FIG. 5 is a cross-sectional view of another exemplary embodiment including a retrograde opening formed over an electroplating seed layer.

FIG. 5 is a cross-sectional view showing another exemplary embodiment of a retrograde opening, in which the retrograde opening 39 is formed over a stopping layer 49 which is ii seed layer for an electroplating process. In this exemplary embodiment, film 25 may be a dielectric film and retrograde openings 39 are formed as described in conjunction with the previous figures, using the two-step (step 1:anisotropic, step 2:selective/isotropic) etching sequence. In various exemplary embodiments, seed stopping layer 49 may be formed of platinum, iridium, TaSiN, or titanium nitride. Other suitable conductive films commonly used as seed layers for electroplating processes may be used. Electrical contacts 51 provide contact from seed stopping layer 49 through substrate stopping layer 31, and to other circuitry (not shown) used to bias seed stopping layer 49.

Figure 6:
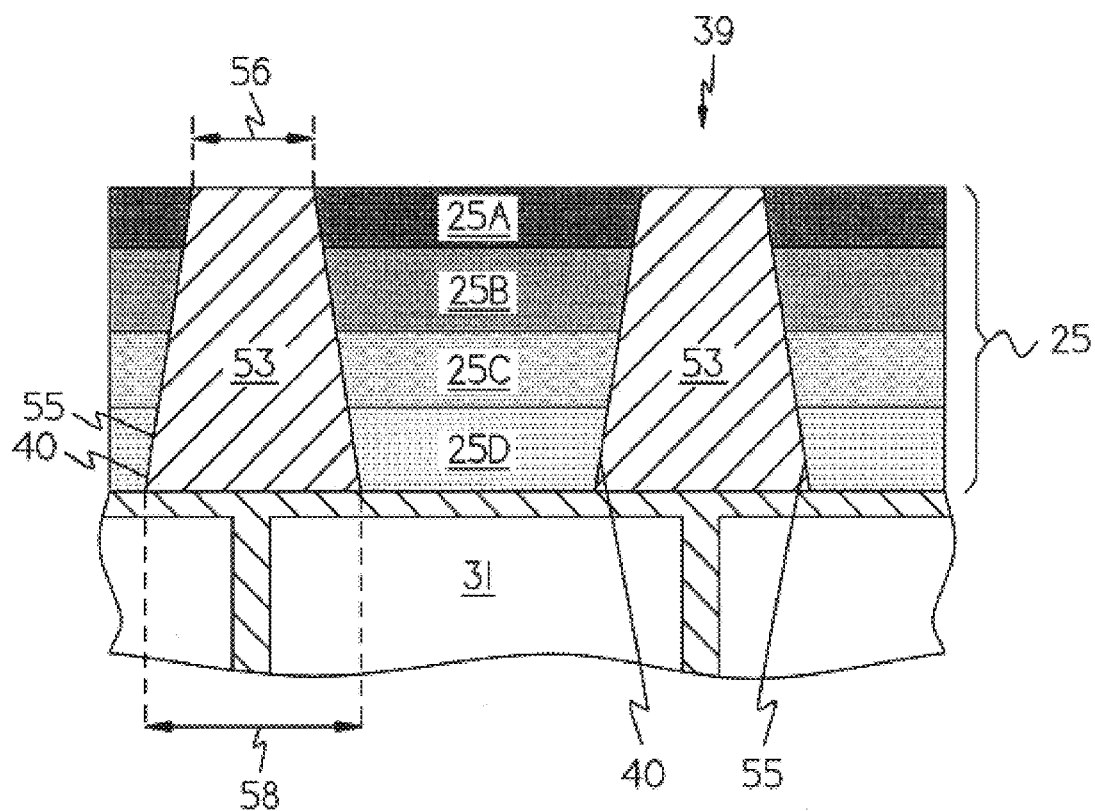
FIG. 6 is a cross-sectional view showing the step following FIG. 5 in the process sequence and includes a conductive material formed within the retrograde opening.

After openings 39 are formed within film 25, electroplated conductive material 53, shown in FIG. 6, is electroplated into openings 39 using conventional electroplating processing techniques. It can be seen that openings 39 are substantially completely filled by conductive material 53. In an exemplary embodiment, conductive material 53 may be platinum, but other commonly electroplated films such as copper may be formed within openings 39. It can be seen that tapered sidewalls 55 of conductive material 53 are essentially conterminous with sidewalls 40 of openings 39. It can also be seen that top line width 56 is less than bottom line width 58, and that top line width 56 and bottom line width 58 are substantially equal to top width 47 and bottom width 46 of opening 39, respectively, as shown in FIG. 3. It should be understood that, in alternative embodiments (net shown), conductive electroplated material 53 may not conform exactly to the features of openings 39.

Figure 7:
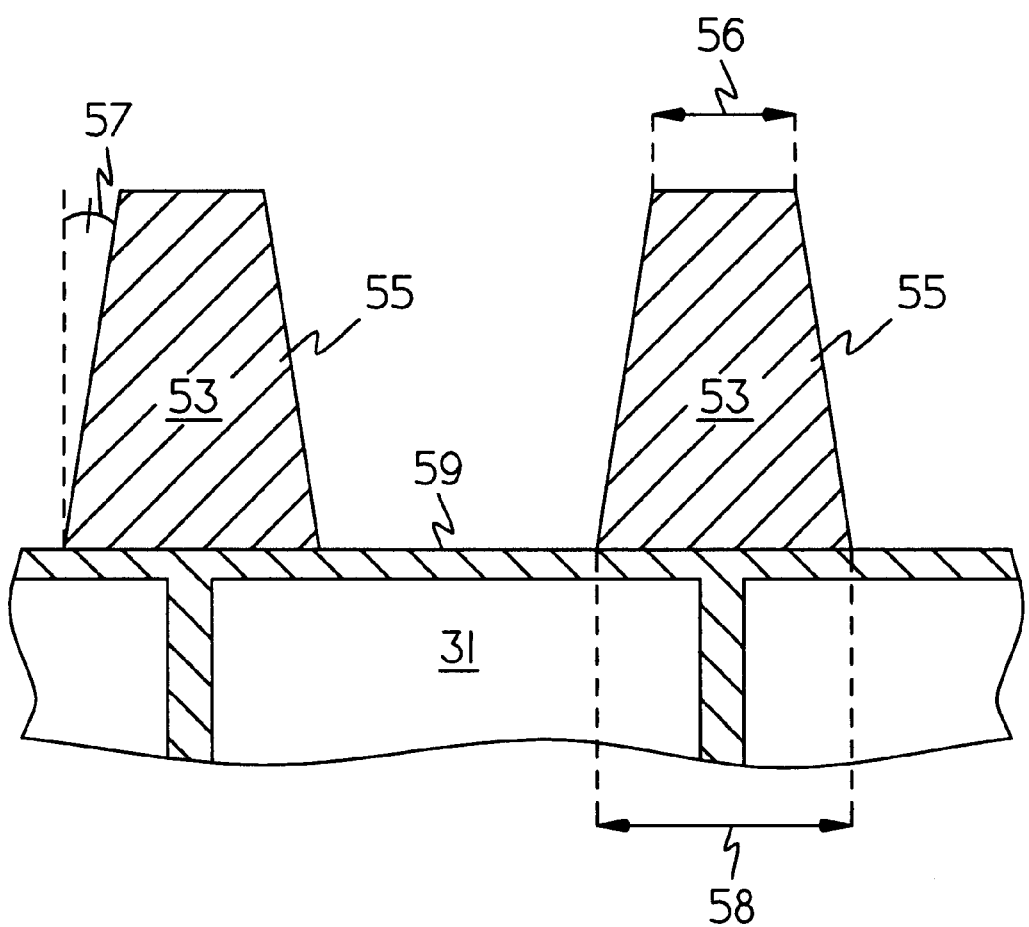
FIG. 7 is a cross-sectional view showing the tapered conductive material after the etched film has been removed.

Now turning to FIG. 7, film 25 has been removed. In the first exemplary embodiment in which film 25 comprises a dielectric film, conventional methods used for selectively removing a dielectric film may be applied. The removal of film 25 produces a wiring pattern of conductive material 53 above the top surface 59 of seed stopping layer 49, and also exposes surface 59 in areas not covered by conductive material 53. It can be seen that conductive material 53 has top line width 56, bottom line width 58, and a tapered cross section. In the exemplary embodiment shown in FIG. 7, the resultant tapered angle 57 formed between sidewall 55 and the normal to surface 59 is within the range of 1.5 to 10°, and preferably within the range of 2 to 6°.

In alternative embodiments in which the electrodeposited conductive material does not conform exactly to the features of openings 39, it should be understood that the dimensions of the conductive material relative to the opening in which it is formed will differ from those described in conjunction with FIGS. 6 and 7.

The foregoing description of preferred embodiments of the invention has been presented for the purposes of illustrating and describing the main points of a concept of the invention. The present invention is not limited, however, to those embodiments.

For example, alternate embodiments may include retrograde openings formed in polysilicon, or other semiconductor films, or other dielectric films, as well as for different applications within the semiconductor manufacturing industry. The characteristic of the film chosen to be varied from the top to the bottom of the film, and which determines the etch rate with respect to the isotropic etchant species and conditions used, may also be varied. The scope of the present invention is expressed by the appended claims.

What is claimed is:

1. A process for forming a retrograde opening in a film, comprising the steps of;
  (a) forming a film having:
    (1) a top,
    (2) bottom, and
    (3) characteristic that varies in the same sense from the top of the film to the bottom of the film;
  (b) applying a first etchant to anisotropically etch an opening in the film extending downward from the top of the film; and
  (c) applying a second etchant:
    (1) to isotropically etch the opening in the film, and
    (2) having a composition based on the characteristic of the film to produce further etching of the film at a first etch rate at a lower portion of the opening that is greater than a second etch rate at a higher portion of the opening resulting in a tapered retrograde opening having a top width and a bottom width greater than the top width.

2. The process as in claim 1, wherein the characteristic comprises a dopant concentration.

3. The process as in claim 1, wherein the characteristic is one of (a) increasing continuously from the top of the film to the bottom of the film, and (b) decreasing continuously from the top of the film to the bottom of the film.

4. The process as in claim 1, wherein the characteristic comprises a relative amount of a constituent of the film.

5. The process as in claim 1, wherein the step (b) comprises reactive ion etching which is non-selective to the characteristic.

6. The process as in claim 1, further comprising the step (a1) of forming a pattern in a masking film placed on the film, and wherein the step (b) comprises anisotropically etching using a reactive ion etching technique.

7. The process as in claim 1, wherein the step (a) comprises sequentially forming a plurality of film sub-layers and doping each film sub-layer with a corresponding dopant concentration, and the characteristic comprises the dopant concentration.

8. The process as in claim 1, wherein the step (a) comprises sequentially forming a plurality of film layers, each film layer formed of a plurality of components, and the characteristic comprises an amount of a first component within a corresponding film layer.

9. The process as in claim 1, wherein the step (c) comprises dry chemical etching.

10. The process as in claim 1, wherein the step (c) comprises wet chemical etching.

* * * * *